United States Patent
Ovard et al.

(10) Patent No.: US 6,324,211 B1
(45) Date of Patent: Nov. 27, 2001

(54) INTERROGATORS COMMUNICATION SYSTEMS COMMUNICATION METHODS AND METHODS OF PROCESSING A COMMUNICATION SIGNAL

(75) Inventors: David K. Ovard, Meridian; Roy Greeff, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/066,738

(22) Filed: Apr. 24, 1998

(51) Int. Cl.[7] ................................ H04B 1/38; H04L 5/16
(52) U.S. Cl. ............................................ 375/219; 375/130
(58) Field of Search ..................................... 375/219, 220, 375/221; 340/572, 573, 824.54; 324/76.39, 76.17, 76.21, 76.41, 76.55, 76.82, 77.11; 342/51, 44, 50; 455/106, 73, 517, 38.2, 54.1, 49.1, 54.2, 19; 370/18, 95.3

(56) References Cited

U.S. PATENT DOCUMENTS

| | | |
|---|---|---|
| 4,075,632 | 2/1978 | Baldwin et al. . |
| 4,504,786 | 3/1985 | Slaughter . |
| 4,926,182 | 5/1990 | Ohta et al. . |
| 5,249,203 | 9/1993 | Loper . |
| 5,617,060 | 4/1997 | Wilson et al. . |
| 5,621,412 | 4/1997 | Sharpe et al. . |
| 5,640,424 | 6/1997 | Banavong et al. . |
| 5,649,296 | 7/1997 | MacLellan . |
| 5,828,955 | 10/1988 | Lipowski et al. . |

FOREIGN PATENT DOCUMENTS

| | | |
|---|---|---|
| 0 501 740 A2 | 2/1992 | (EP) . |
| WO 97/08842 | 3/1997 | (WO) . |

OTHER PUBLICATIONS

U.S. application Ser. No. 08/705,043, O'Toole et al., filed Aug. 29, 1992.
P. 827 of New IEEE Standard Dictionary of Electrical & Electronic Terms, 1993.
U.S. application No. 08/705,043, O'Toole et al., filed Aug. 29, 1996.

Primary Examiner—William Luther
(74) Attorney, Agent, or Firm—Wells, St. John, Roberts, Gregory & Matkin, P.S.

(57) ABSTRACT

The present invention includes interrogators, communication systems, communication methods, and methods of processing a communication signal. One aspect of the present invention provides a backscatter system interrogator including a downconverter configured to receive a backscatter communication signal having a first frequency and convert the backscatter communication signal having the first frequency to a subcarrier signal having a second frequency less than the first frequency; a filter coupled with the downconverter and configured to filter direct path energy from the subcarrier signal; and a gain control coupled with the filter and configured to adjust the gain of the filtered subcarrier signal.

61 Claims, 6 Drawing Sheets

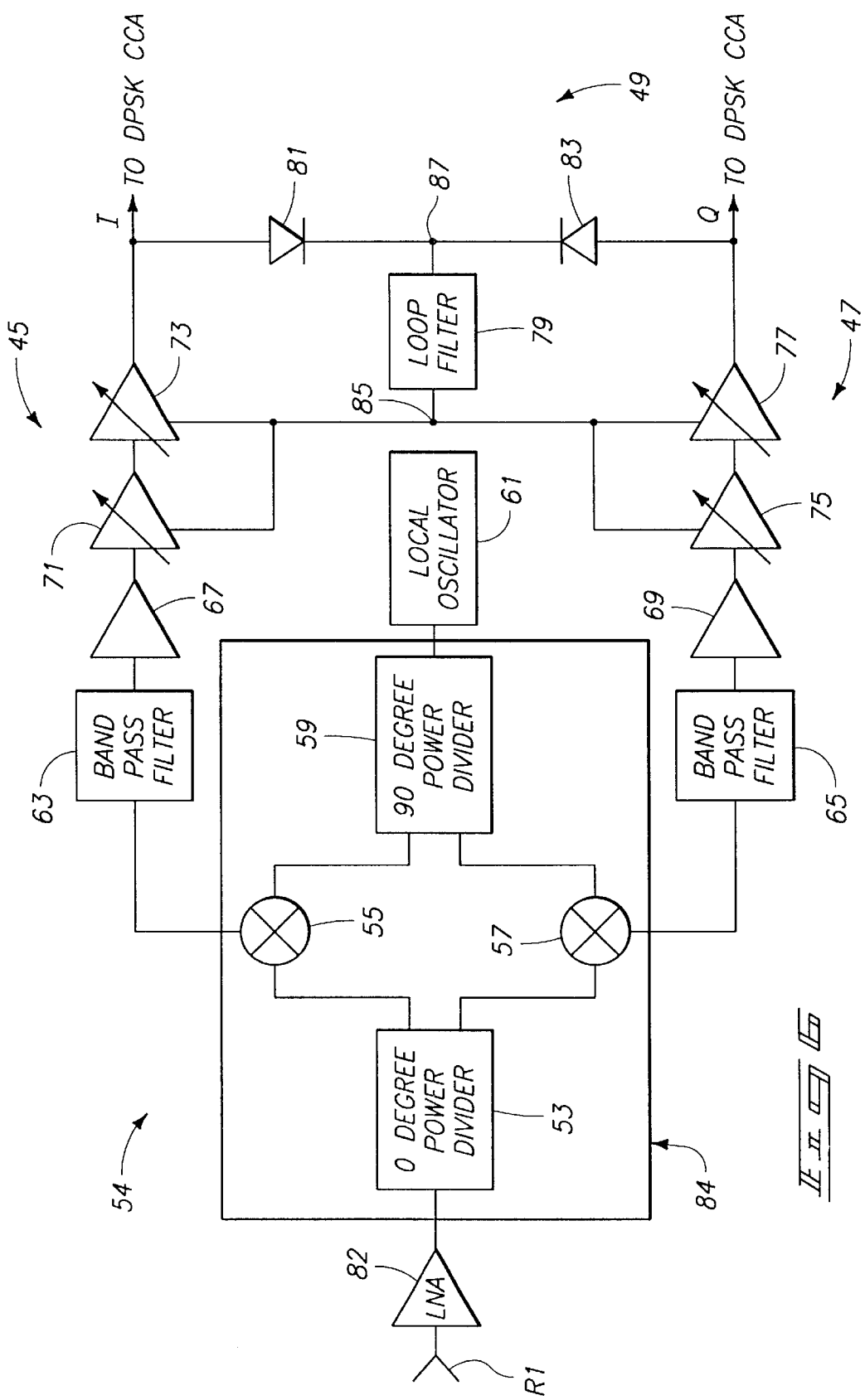

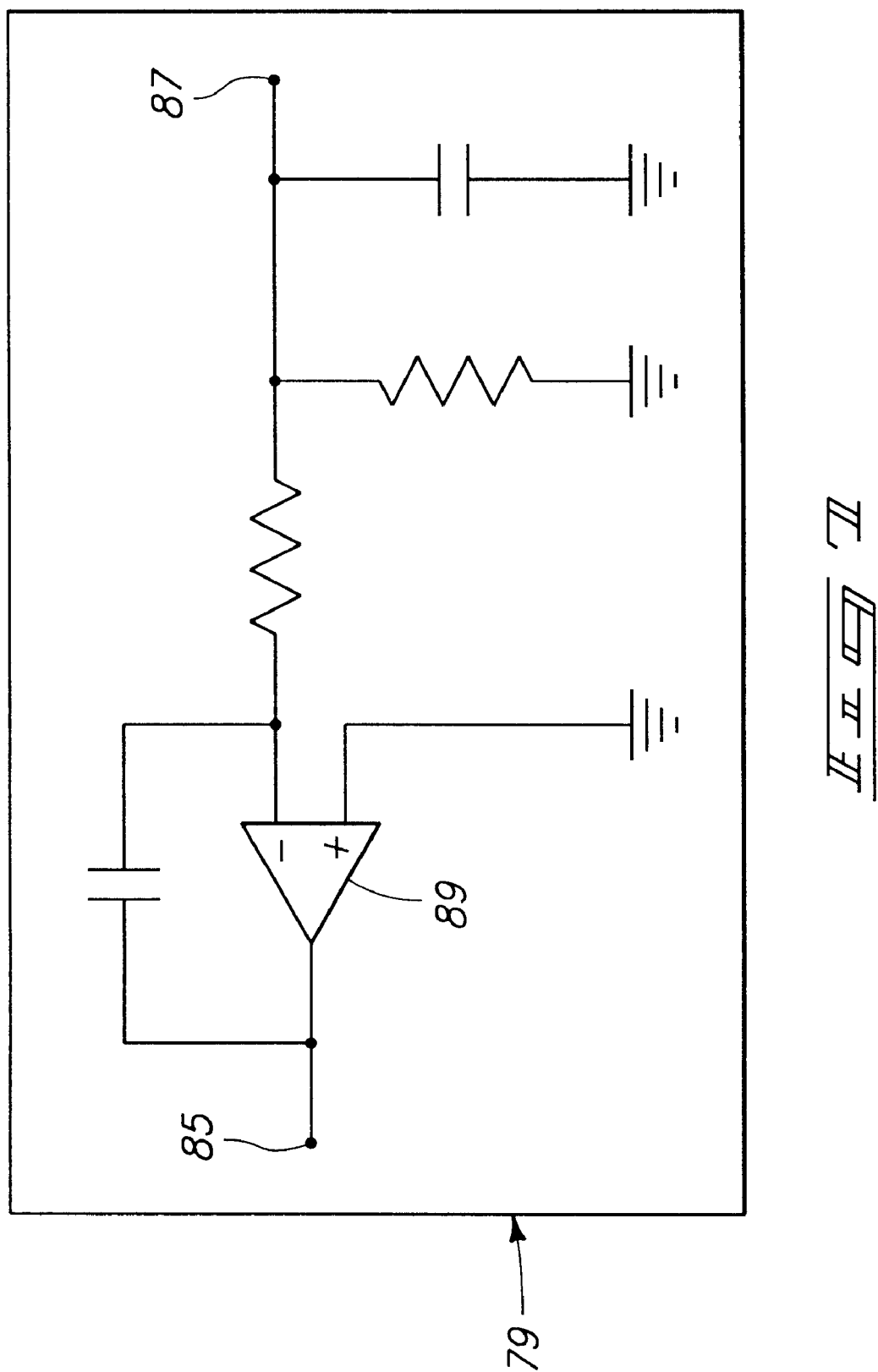

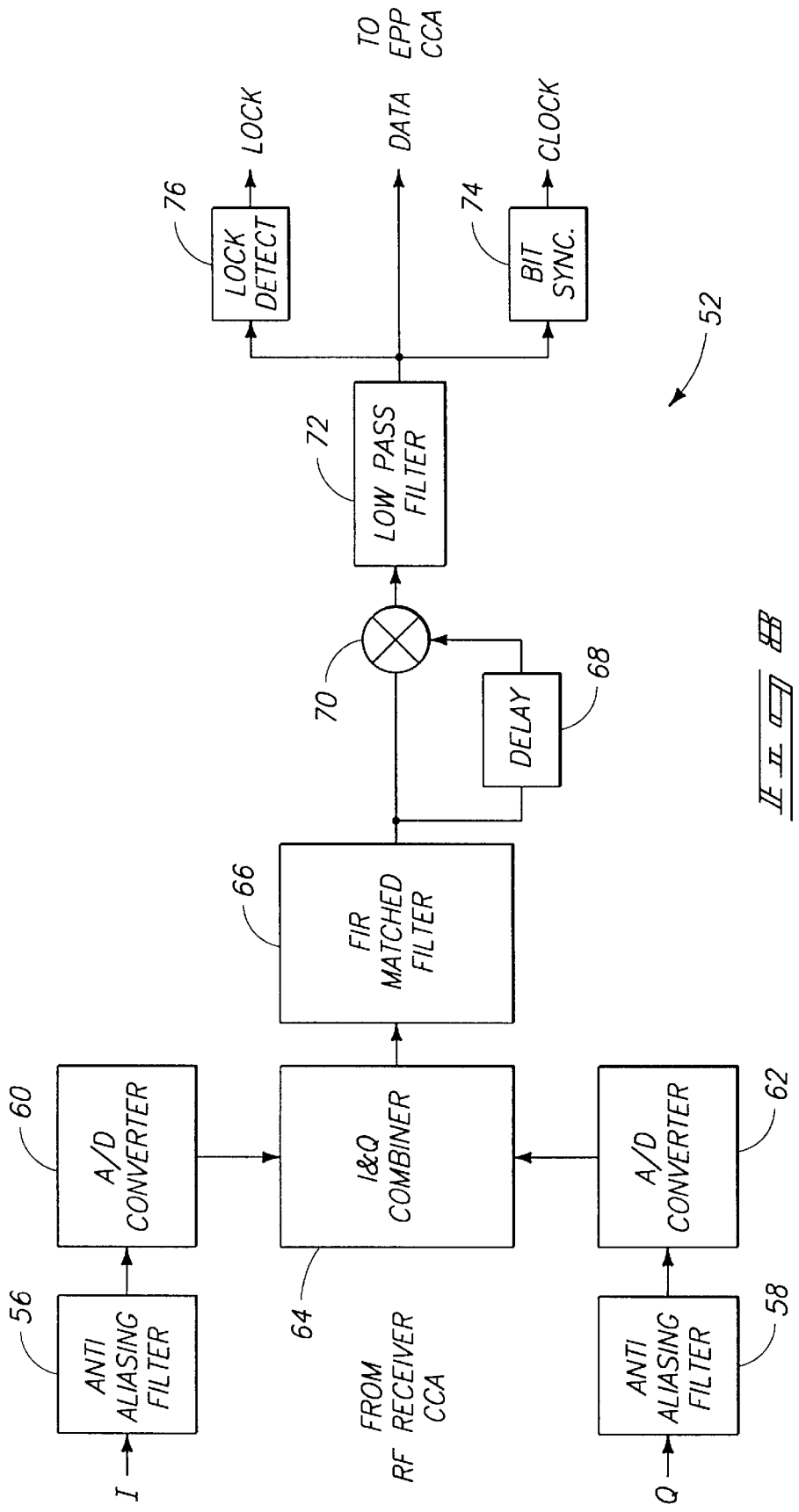

INTERROGATORS COMMUNICATION SYSTEMS COMMUNICATION METHODS AND METHODS OF PROCESSING A COMMUNICATION SIGNAL

TECHNICAL FIELD

The present invention relates to interrogators, communication systems, communication methods, and methods of processing a communication signal.

BACKGROUND OF THE INVENTION

Backscatter communication systems are known in the art. In an exemplary backscatter system, one transponder, such as an interrogator, sends out a command to a remote communications device. After the interrogator transmits the command, and is expecting a response, the interrogator switches to a CW mode (continuous wave mode). In the continuous wave mode, the interrogator does not transmit any information. Instead, the interrogator just transmits radiation at a certain frequency. In other words, the signal transmitted by the interrogator is not modulated.

After a remote communications device receives a command from the interrogator, the remote communications device processes the command. The remote communications device of the backscatter system modulates the continuous wave by switching between absorbing RF radiation and reflecting RF radiation. For example, the remote communications device alternately reflects or does not reflect the signal from the interrogator to send its reply. Two halves of a dipole antenna can be either shorted together or isolated from each other to modulate the continuous wave.

One example of a backscatter system is described in commonly assigned U.S. patent application Ser. No. 08/705,043, filed Aug. 29, 1996, and incorporated herein by reference. Another example of a backscatter system is described in U.S. Pat. No. 5,649,296 to MacLellan et al. which is also incorporated herein by reference.

One application for backscatter communications is in wireless electronic identification systems, such as those including radio frequency identification devices. Of course, other applications for backscatter communications exist as well.

Most presently available radio frequency identification devices utilize a magnetic coupling system. An identification device is usually provided with a unique identification code in order to distinguish between a number of different devices. Typically, the devices are entirely passive (have no power supply), which results in a small and portable package. However, such identification systems are only capable of operation over a relatively short range, limited by the size of a magnetic field used to supply power to the devices and to communicate with the devices.

Another wireless electronic identification system utilizes a large, board level, active transponder device affixed to an object to be monitored which receives a signal from an interrogator. The device receives the signal, then generates and transmits a responsive signal. The interrogation signal and the responsive signal are typically radio-frequency (RF) signals produced by an RF transmitter circuit. Because active devices have their own power sources. The active devices do not need to be in close proximity to an interrogator or reader to receive power via magnetic coupling. Therefore, active transponder devices tend to be more suitable for applications requiring tracking of objects that may not be in close proximity to the interrogator, such as a railway car.

In many applications, the path length intermediate the communicating devices of the system varies responsive to movement of the devices. Moving objects within the communications enviromnent or intermediate the communicating devices can cause communication disturbances. Further, some interference may bleed into the received signal of backscatter interrogators inasmuch as backscatter interrogators are configured to emit radiation while receiving data from a remote device. It is preferred to reduce or otherwise minimize noise and other disturbances to provide robust communications.

SUMMARY OF THE INVENTION

Backscatter interrogators are configured in one embodiment to provide direct energy path filtering of subcarrier signals. The interrogators of the present invention preferably provide gain controls to adjust the gain of the subcarrier signals.

One aspect of the present invention provides a backscatter system interrogator. The disclosed interrogator includes a downconverter configured to receive a backscatter communication signal and convert the backscatter communication signal to a subcarrier signal. The subcarrier signal can include an in-phase signal and a quadrature signal. The interrogator further includes a filter configured to remove direct path energy from the converted backscatter communication signal. The interrogator preferably includes a gain control configured to adjust the gain of the filtered backscatter communication signal.

A second aspect of the invention provides a communication system comprising an electronic communication device and an interrogator. The communication device is configured to output a communication signal and the interrogator is configured to receive and process the signal. The interrogator is configured to downconvert the communication signal to a subcarrier signal and filter direct path energy from the downconverted signal. The interrogator is further configured to adjust the gain of the subcarrier signal.

Another aspect of the present invention provides a backscatter communication method. The method comprises outputting a command signal and receiving a reply signal responsive to the outputting the command signal. The method further comprises downconverting the reply signal to a subcarrier frequency and removing direct path energy from the reply signal. The method also includes adjusting the gain of the filtered reply signal.

Yet another aspect of the present invention provides a method of processing a received communication signal. The method comprises receiving a communication signal and downconverting the communication signal to an in-phase signal and a quadrature signal. The method also comprises filtering the in-phase signal and the quadrature signal and adjusting the gain of the in-phase signal and the quadrature signal.

BRIEF DESCRIPTION OF THE DRAWINGS

Preferred embodiments of the invention are described below with reference to the following accompanying drawings.

FIG. 6 is a circuit schematic of RF circuitry included in the interrogator of FIG. 5.

FIG. 7 is a circuit schematic of a loop filter included in the RF circuitry of FIG. 6.

FIG. 8 is a circuit schematic of DPSK circuitry included in the interrogator of FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
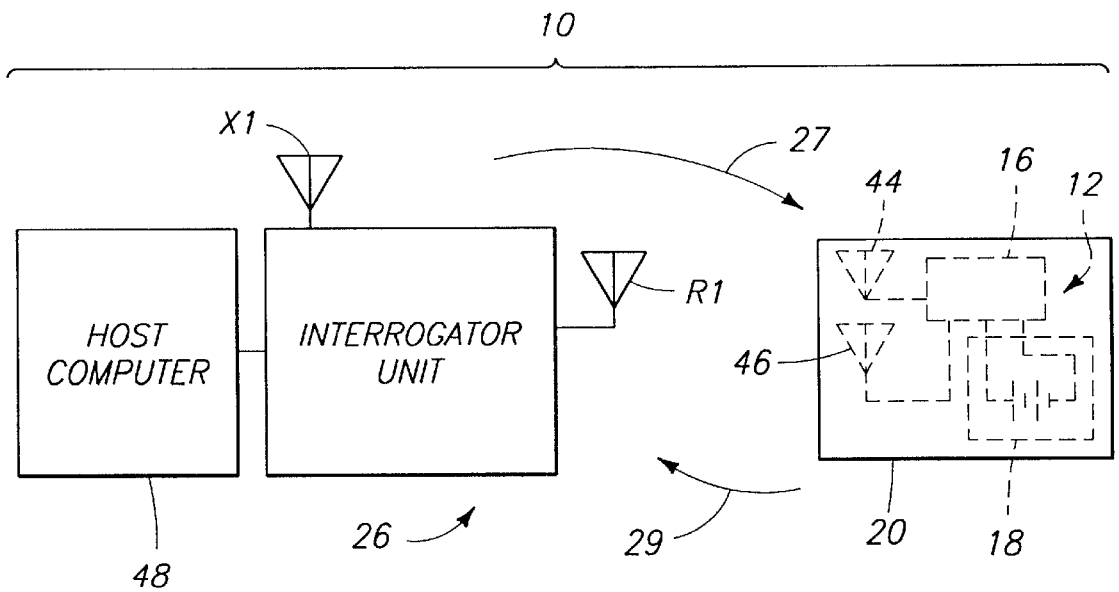
FIG. 1 is a block diagram illustrating a communication system embodying the invention.
Figure 4:
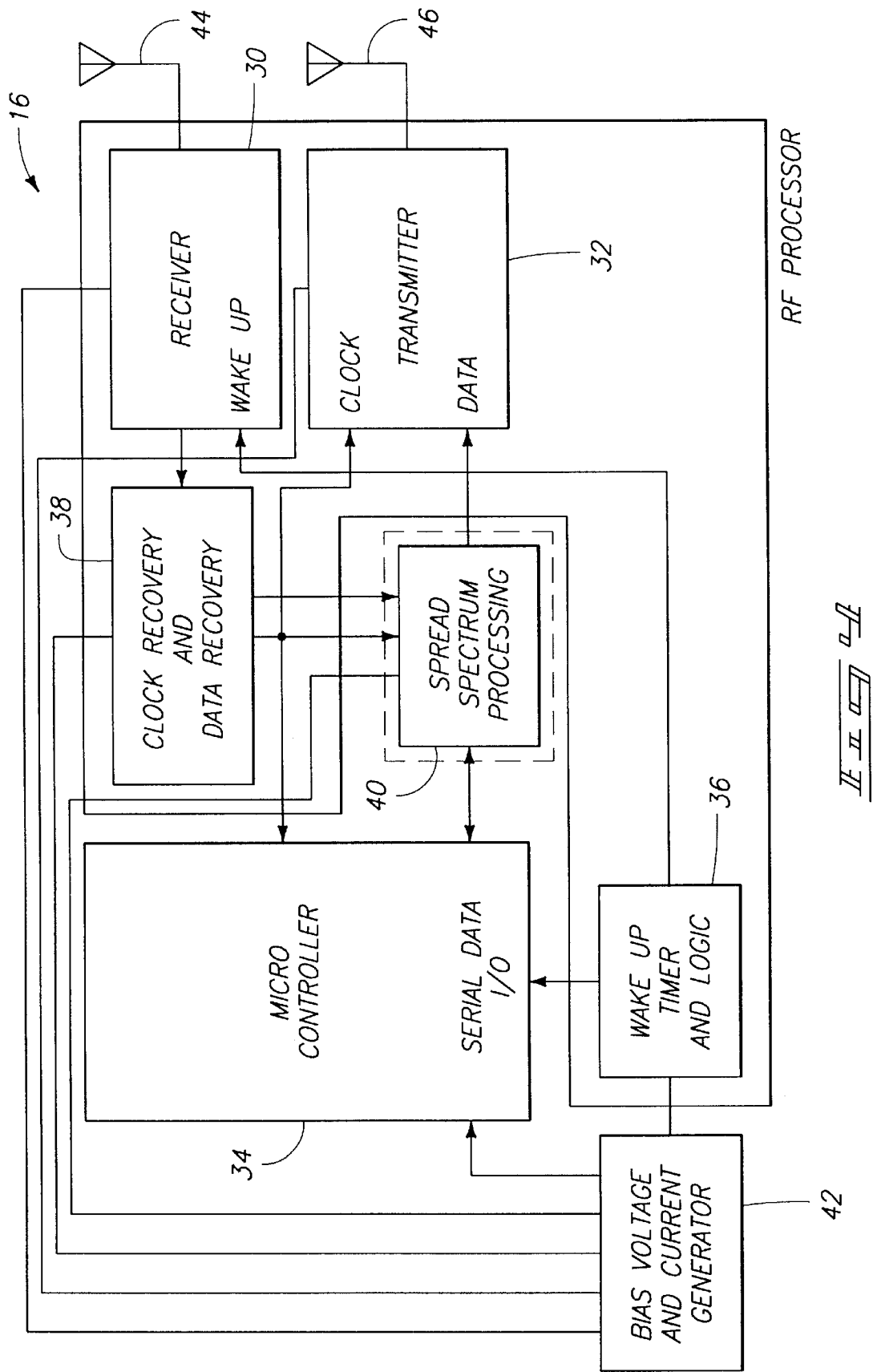
FIG. 4 is a circuit schematic of a transponder included in the system of FIG. 1.

FIG. 1 illustrates a wireless communications system 10 embodying the invention. Communications system 10 includes a first transponder, including an interrogator 26, and a host computer 48 in communication with interrogator 26. Communications system 10 further includes an electronic communications device 12, such as the device disclosed in U.S. patent application Ser. No. 08/705,043, filed Aug. 29, 1996. In one embodiment, wireless communications device 12 comprises a wireless identification device such as the Microstamp (TM) integrated circuit available from Micron Communications, Inc., 3176 S. Denver Way, Boise, Id. 83705. Interrogator 26 communicates with the communications device 12 via an electromagnetic link, such as via an RF link (e.g., at microwave frequencies, in one embodiment). While other embodiments are possible, in the illustrated embodiment the communications device 12 includes a transponder 16 having a receiver 30 and a transmitter 32 (FIG. 4). Communications device 12 further includes a power source 18 connected to transponder 16 to supply power to transponder 16. Communications device 12 further includes at least one antenna connected to transponder 16 for wireless transmission and reception. In the illustrated embodiment, communications device 12 includes at least one antenna 46 connected to transponder 16 for radio frequency transmission by transponder 16, and at least one receive antenna 44 connected to transponder 16 for radio frequency reception by transponder 16. In the illustrated embodiment, the transmit antenna 46 is a dipole antenna, and the receive antenna 44 is a loop antenna. In the illustrated embodiment, the transponder 16 is in the form of an integrated circuit. However, in alternative embodiments, all of the circuitry of transponder 16 is not necessarily all included in a single integrated circuit.

Power source 18 is a thin film battery in the illustrated embodiment; however, in alternative embodiments, other forms of power sources can be employed. If the power source 18 is a battery, the battery can take any suitable form. Preferably, the battery type will be selected depending on weight, size, and life requirements for a particular application. In one embodiment, the battery 18 is a thin profile button-type cell forming a small, thin energy cell more commonly utilized in watches and small electronic devices requiring a thin profile. A conventional button-type cell has a pair of electrodes, an anode formed by one face and a cathode formed by an opposite face. In an alternative embodiment, the battery comprises a series connected pair of button type cells.

The communications device 12 can be included in any appropriate housing or packaging.

Figure 2:
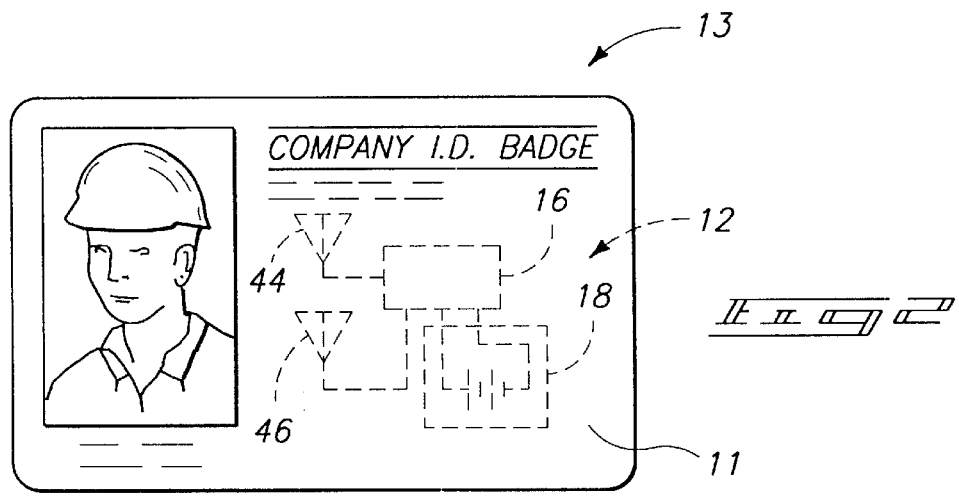
FIG. 2 is a front view of an employee badge according to one embodiment of the invention.

FIG. 2 shows but one example of a housing in the form of a card 11 comprising plastic or other suitable material. The plastic card 11 houses communications device 12 to define an employee identification badge 13 including the communications device 12. In one embodiment, the front face of badge 13 has visual identification features such as an employee photograph or a fingerprint in addition to identifying text.

Figure 3:
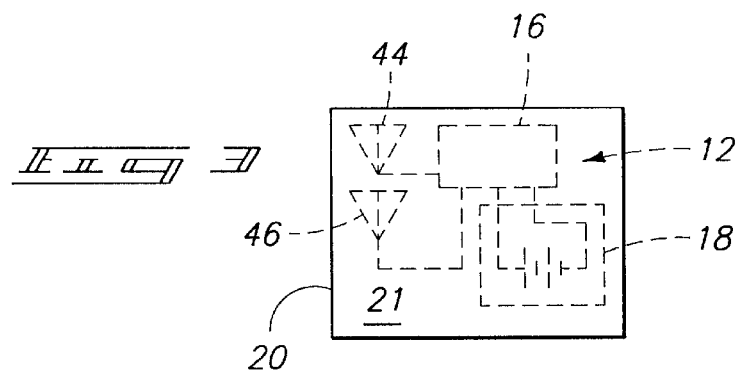
FIG. 3 is a front view of a radio frequency identification tag according to another embodiment of the invention.

FIG. 3 illustrates but one alternative housing supporting the device 12. More particularly, FIG. 3 illustrates a miniature housing 20 encasing the device 12 to define a tag which can be supported by an object (e.g., hung from an object, affixed to an object, etc.).

Although two particular types of housings have been disclosed, the communications device 12 can be included in any appropriate housing. Communications device 12 is of a small size that lends itself to applications employing small housings, such as cards, miniature tags, etc. Larger housings can also be employed. The communications device 12, housed in any appropriate housing, can be supported from or attached to an object in any desired manner. Interrogator unit 26 includes a plurality of antennas X1, R1, as well as transmitting and receiving circuitry, similar to that implemented in the device 16. The host computer 48 acts as a master in a master-slave relationship with interrogator 26. The host computer 48 includes an applications program for controlling the interrogator 26 and interpreting responses, and a library of radio frequency identification device applications or functions. Most of the functions communicate with interrogator 26. These functions effect radio frequency communication between interrogator 26 and communications device 12.

Communications system 10 includes a transmit antenna X1, and a receive antenna R1 connected to interrogator 26. In operation, the interrogator 26 transmits an interrogation signal or command signal 27 ("forward link") via the antenna X1. The communications device 12 receives the incoming interrogation signal via its antenna 44. Upon receiving the signal 27, the communications device 12 responds by generating and transmitting a responsive signal or reply signal 29 ("return link"). The interrogator 26 is described in greater detail below.

In one embodiment, the responsive signal 29 is encoded with information that uniquely identifies, or labels the particular device 12 that is transmitting, so as to identify any object or person with which communications device 12 is associated.

In the embodiment illustrated in FIG. 1, multiple communications devices 12 can be employed; however, there is no communication between multiple devices 12. Instead, the multiple communications devices 12 communicate with interrogator 26. FIG. 1 illustrates the communications device 12 as being in the housing 20 of FIG. 3. The system would operate in a similar manner if the device 12 is provided in a housing such as the housing 10 of FIG. 2, or any other appropriate housing. Multiple communications devices 12 can be used in the same field of an interrogator 26 (i.e., within communications range of an interrogator 26). Similarly, multiple interrogators 26 can be in proximity to one or more of the devices 12.

The above described system 10 is advantageous over prior art devices that utilize magnetic field effect systems because, with the system 10, a greater range can be achieved, and more information can be obtained (instead of just an identification number).

As a result, such a system 10 can be used, for example, to monitor large warehouse inventories having many unique products needing individual discrimination to determine the presence of particular items within a large lot of tagged products.

FIG. 4 is a high level circuit schematic of the transponder 16 utilized in the devices of FIGS. 1–3. In the embodiment shown in FIG. 4, the transponder 16 is a monolithic integrated circuit. More particularly, in the illustrated embodiment, the integrated circuit 16 comprises a single die, having a size of 209×116 mils$^2$, including the receiver 30, the transmitter 32, a micro controller or microprocessor 34, a wake up timer and logic circuit 36, a clock recovery and data recovery circuit 38, and a bias voltage and current generator 42.

In one embodiment, the communications devices 12 switch between a "sleep" mode of operation, and higher power modes to conserve energy and extend battery life during periods of time where no interrogation signal 27 is received by devices 12, using the wake up timer and logic circuitry 36.

In one embodiment, a spread spectrum processing circuit 40 is included in transponder 16. In this embodiment, signals transmitted and received by interrogator 26, and transmitted and received by communications device 12 are modulated spread spectrum signals. Spread spectrum modulation is described below.

Many modulation techniques minimize required transmission bandwidth. However, the spread spectrum modulation technique employed in the illustrated embodiment requires a transmission bandwidth that is up to several orders of magnitude greater than the minimum required signal bandwidth. Although spread spectrum modulation techniques are bandwidth inefficient in single user applications, they are advantageous where there are multiple users, as is the case with the instant radio frequency identification system 24. The spread spectrum modulation technique of the illustrated embodiment is advantageous because the interrogator signal can be distinguished from other signals (e.g., radar, microwave ovens, etc.) operating at the same frequency. The spread spectrum signals transmitted by communications device 12 and by interrogator 26 are pseudo random and have noise-like properties when compared with the digital command or reply. The spreading waveform is controlled by a pseudo-noise or pseudo random number (PN) sequence or code. The PN code is a binary sequence that appears random but can be reproduced in a predetermined manner by the device 12. More particularly, incoming spread spectrum signals are demodulated by communications device 12 or by interrogator 26 through cross correlation with a version of the pseudo random carrier that is generated by communications device 12 itself or interrogator 26 itself, respectively. Cross correlation with the correct PN sequence unspreads the spread spectrum signal and restores the modulated message in the same narrow band as the original data.

A pseudo-noise or pseudo random sequence (PN sequence) is a binary sequence with an autocorrelation that resembles, over a period, the autocorrelation of a random binary sequence. The autocorrelation of a pseudo-noise sequence also roughly resembles the autocorrelation of band-limited white noise. A pseudo-noise sequence has many characteristics that are similar to those of random binary sequences. For example, a pseudo-noise sequence has a nearly equal number of zeros and ones, very low correlation between shifted versions of the sequence, and very low cross correlation between any two sequences. A pseudo-noise sequence is usually generated using sequential logic circuits. For example, a pseudo-noise sequence can be generated using a feedback shift register.

A feedback shift register comprises consecutive stages of two state memory devices, and feedback logic. Binary sequences are shifted through the shift registers in response to clock pulses, and the output of the various stages are logically combined and fed back as the input to the first stage. The initial contents of the memory stages and the feedback logic circuit determine the successive contents of the memory.

The illustrated embodiment employs direct sequence spread spectrum modulation. A direct sequence spread spectrum (DSSS) system spreads the baseband data by directly multiplying the baseband data pulses with a pseudo-noise sequence that is produced by a pseudo-noise generator. A single pulse or symbol of the PN waveform is called a "chip." Synchronized data symbols, which may be information bits or binary channel code symbols, are added in modulo-2 fashion to the chips before being modulated. The receiver performs demodulation. For example, in one embodiment the data is amplitude modulated. Assuming that code synchronization has been achieved at the receiver, the received signal passes through a wideband filter and is multiplied by a local replica of the PN code sequence. This multiplication yields the unspread signal.

A pseudo-noise sequence is usually an odd number of chips long. In the illustrated embodiment, one bit of data is represented by a thirty-one chip sequence. A zero bit of data is represented by inverting the pseudo-noise sequence.

Spread spectrum techniques are also disclosed in "Spread Spectrum Systems," by R. C. Dixon, published by John Wiley and Sons, Inc., incorporated herein by reference.

In operation, the interrogator sends out a command that is spread around a certain center frequency (e.g, 2.44 GHz). After the interrogator transmits the command, and is expecting a response, the interrogator switches to a CW mode (continuous wave mode). In the continuous wave mode, the interrogator does not transmit any information. Instead, the interrogator just transmits 2.44 GHz radiation. In other words, the signal transmitted by the interrogator is not modulated. After the communications device 12 receives the command from the interrogator, the communications device 12 processes the command. If communications device 12 is in a backscatter mode it alternately reflects or does not reflect the signal from the interrogator to send its reply. For example, in the illustrated embodiment, two halves of a dipole antenna are either shorted together or isolated from each other to send a reply.

In one embodiment, the clock for the entire integrated circuit 16 is extracted from the incoming message itself by clock recovery and data recovery circuitry 38. This clock is recovered from the incoming message, and used for timing for the micro controller 34 and all the other clock circuitry on the chip, and also for deriving the transmitter carrier or the subcarrier, depending on whether the transmitter is operating in active mode or backscatter mode.

In addition to recovering a clock, the clock recovery and data recovery circuit 38 also performs data recovery on valid incoming signals. The valid spread spectrum incoming signal is passed through the spread spectrum processing circuit 40, and the spread spectrum processing circuit 40 extracts the actual ones and zeros of data from the incoming signal. More particularly, the spread spectrum processing circuit 40 takes the chips from the spread spectrum signal, and reduces each thirty-one chip section down to a bit of one or zero, which is passed to the micro controller 34.

Micro controller 34 includes a serial processor, or I/O facility that receives the bits from the spread spectrum processing circuit 40. The micro controller 34 performs further error correction. More particularly, a modified hamming code is employed, where each eight bits of data is accompanied by five check bits used by the micro controller 34 for error correction. Micro controller 34 further includes a memory, and after performing the data correction, micro controller 34 stores bytes of the data bits in memory. These bytes contain a command sent by the interrogator 26. The micro controller 34 responds to the command.

For example, the interrogator 26 may send a command requesting that any communications device 12 in the field respond with the device's identification number. Status information is also returned to interrogator 26 from communications device 12 when communications device 12 responds.

The transmitted replies have a format similar to the format of incoming messages. More particularly, a reply starts with a preamble (e.g., all zeros in active mode, or alternating double zeros and double ones in backscatter mode), followed by a Barker or start code, followed by actual data.

The incoming message and outgoing reply preferably also include a check sum or redundancy code so that integrated circuit 12 or interrogator 26 can confirm receipt of the entire message or reply.

Interrogator 26 provides a communication link between a host computer and transponder 16. Interrogator 26 connects to the host computer 48 via an IEEE-1284 enhanced parallel port (EPP). The interrogator communicates with transponder 16 via the RF antennas X1 and R1.

A Maximal Length Pseudo Noise (PN) Sequence is used in the Direct Sequence Spread Spectrum (DSSS) communications scheme in the forward link. In one embodiment, the sequence is generated by a linear feedback shift register. This produces a repeating multiple "chip" sequence.

A zero bit is transmitted as one inverted full cycle of the PN sequence. A one bit is transmitted as one full non-inverted cycle of the PN sequence.

After sending a command, the interrogator sends a continuous unmodulated RF signal with a frequency of 2.44175 GHz. Return link data is Differential Phase Shift Key (DPSK) modulated onto a square wave subcarrier with a frequency of approximately 600 kHz (e.g., 596.1 kHz in one embodiment). A data 0 corresponds to one phase and data 1 corresponds to another, shifted 180 degrees from the first phase. The subcarrier is used to modulate antenna impedance of transponder 16. For a simple dipole, a switch between the two halves of the dipole antenna is opened and closed. When the switch is closed, the antenna becomes the electrical equivalent of a single half-wavelength antenna that reflects a portion of the power being transmitted by the interrogator. When the switch is open, the antenna becomes the electrical equivalent of two quarter-wavelength antennas that reflect very little of the power transmitted by the interrogator. In one embodiment, the dipole antenna is a printed microstrip half wavelength dipole antenna.

Figure 5:
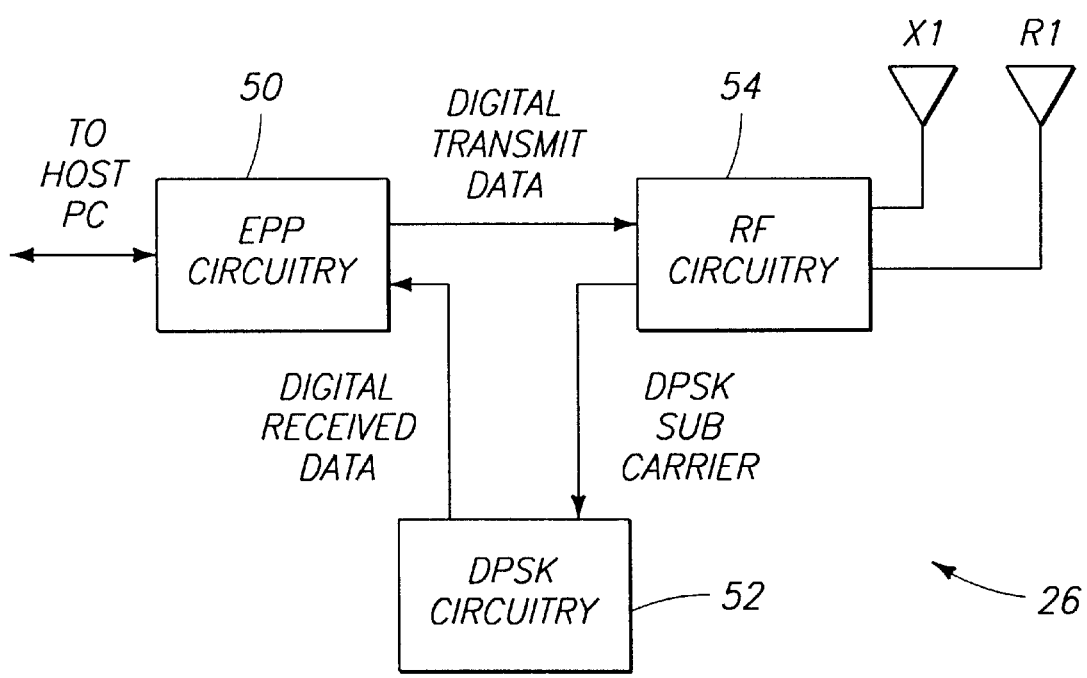
FIG. 5 is a block diagram of an interrogator in accordance with one embodiment of the invention.

Referring to FIG. 5, one embodiment of interrogator 26 includes enhanced parallel port (EPP) circuitry 50, DPSK (differential phase shift keyed) circuitry 52, and RF (radio frequency) circuitry 54, as well as a power supply (not shown) and a housing or chassis (not shown). In the illustrated embodiment, the enhanced parallel port circuitry 50, the DPSK circuitry 52, and the RF circuitry 54 respectively define circuit card assemblies (CCAs). The interrogator uses an IEEE-1284 compatible port in EPP mode to communicate with host computer 48. The EPP circuitry 50 provides digital logic required to coordinate sending and receiving a message with transponder 16. The EPP circuitry 50 buffers data to transmit from the host computer 48, converts the data to serial data, and encodes it. The EPP circuitry 50 then waits for data from transponder 16, converts it to parallel, and transfers it to host computer 48. In one embodiment, messages include up to 64 bytes of data.

The EPP mode interface provides an asynchronous, interlocked, byte wide, bidirectional channel controlled by a host device. The EPP mode allows the host computer to transfer, at high speed, a data byte to/from the interrogator within a single host computer CPU I/O cycle (typically 0.5 microseconds per byte).

Referring to FIG. 6, exemplary radio frequency receive operations of interrogator 26 are described. RF circuitry 54 of interrogator 26 interfaces with transmit and receive antennas X1, R1. Although transmit operations are not shown in FIG. 6, RF circuitry 54 is configured to modulate a carrier signal for transmission of data to a remote communications device. In particular, RF circuitry 54 defines a transmitter, and receives data from EPP circuitry 50. RF circuitry 54 can be configured to provide amplitude modulation (AM) of a carrier signal responsive to data from EPP circuitry 50.

Further, RF circuitry 54 is configured to provide a continuous wave (CW) carrier for backscatter communications with the remote communication device (if backscatter communications are employed).

During continuous wave (CW) transmissions for the backscatter mode, RF circuitry 54 is configured to transmit the CW signal using antenna X1. When interrogator 26 is transmitting in the CW mode, transponder 16 selectively backscatters the signal with a DPSK modulated subcarrier providing a microwave communication signal in the described embodiment.

As described in detail below, RF circuitry 54 is configured to receive and downconvert signals received from a transponder unit of a remote communications device. Such signals comprise backscatter signals in the described embodiment.

With reference to receive operations, RF circuitry 54 includes a power divider and a frequency synthesizer configured to tune to the RF continuous wave carrier. The backscattered signal is received via receive antenna R1 in the described embodiment. RF circuitry 54 includes a low noise amplifier (LNA) 82 coupled to antenna R1 to amplify the received signal.

RF circuitry 54 further includes a quadrature downconverter 84 coupled with amplifier 82. Downconverter 84 is configured to receive the communication signal from antenna R1 and convert the communication signal to the subcarrier having a frequency less than the frequency of the carrier. Downconverter 84 is configured to convert the received communication signal to an in-phase (I) signal and a quadrature (Q) signal individually having a subcarrier frequency, such as 600 kHz.

The depicted quadrature downconverter 84 includes plural power dividers 53, 59 and plural mixers 55, 57. Power divider 53 comprises a zero degree power divider in the depicted embodiment and is configured to receive the microwave communication signal from amplifier 82.

Power divider 59 comprises a 90 degree power divider which is coupled with local oscillator 61. Local oscillator 61 can be configured to implement frequency synthesizer operations. In particular, local oscillator 61 is configured to generate a reference signal utilized for RF communications within communication system 10. In one embodiment, communication system 10 comprises a coherent system wherein local oscillator 61 generates a carrier signal utilized for transmission operations within interrogator 26. Local oscillator 61 can be utilized to also generate the continuous wave (CW) signal, and also a reference signal which is applied to downconverter 84 for receive operations within interrogator 26.

As referred to above, local oscillator 61 is configured to generate and apply an approximate 2.44 GHz reference signal to power divider 59 for RF communications. In the described embodiment, the signal received via antenna R1 and applied to power divider 53 comprises a 2.44 GHz signal.

Mixers 55, 57 are configured to mix the output of power divider 53 with the output of power divider 59. Mixing the outputs of power dividers 53, 59 provides the quadrature downconverting operations and generates the subcarrier signal. In particular, mixer 55 is configured to output an in-phase (I) signal. Mixer 57 is configured to output a quadrature (Q) signal. In the described embodiment, signals I, Q have a frequency of approximately 600 kHz responsive to the modulation frequency within the remote communication device 12.

Plural filters 63, 65 are coupled with downconverter 84 and are configured to filter direct path energy from the received and converted communication signals (e.g., signals I, Q). In the described embodiment, signals I, Q are applied to respective filters 63, 65 within the respective I and Q channels. Filters 63, 65 comprise band pass filters according to one embodiment. Filters 63, 65 are configured to pass frequencies above 100 and below 1 MHz in the described embodiment. Other pass bands could be utilized.

Filters 63, 65 are preferably configured to filter the respective in-phase and quadrature signals about the subcarrier frequency. More specifically, filters 63, 65 are configured to band limit the in-phase signal and quadrature signal. Filters 63, 65 comprise band pass filters configured to filter the in-phase signal and the quadrature signal about the subcarrier frequency. Such removes direct path energy and higher frequency products (e.g., X2 components) resulting from the mixing of plural 2.44 GHz signals.

Such is desired inasmuch as interrogator 26 is typically simultaneously transmitting the CW signal using antenna X1 during reception of communication signals using antenna R1. Communications via X1 and R1 typically occur at approximately the same frequencies. Thus, a certain amount of signal may bleed over from the transmitted signals. Other energy may be reflected from static objects present in the communication environment. In addition, low frequency modulations may be present responsive to moving objects within the communication environment. As a result, DC signals and low frequency signals may be present within signals I, Q. Filters 63, 65 remove noise and other undesired frequencies from signals I, Q.

The filtered in-phase signal and quadrature signal are applied to respective amplifiers 67, 69. Exemplary amplifiers 67, 69 have designation CLC425 available from National Semiconductor Corporation.

Gain controls 45, 47 are coupled with respective amplifiers 67, 69. Gain controls 45, 47 are preferably configured to operate upon subcarrier information of the backscatter receiver of interrogator 26. The depicted gain controls comprise automatic gain control (AGC) amplifiers in the depicted embodiment. Exemplary automatic gain control amplifiers individually have designation CLC5523 available from National Semiconductor Corporation.

In the preferred embodiment, plural automatic gain control (AGC) amplifiers are coupled with amplifiers 67, 69. In particular, AGC amplifiers are cascaded within the respective in-phase and quadrature signal lines or channels. Cascaded amplifiers 71, 73 are coupled with amplifier 67 and configured to receive the in-phase signal. Cascaded AGC amplifiers 75, 77 are coupled with amplifier 69 and are configured to receive the quadrature signal.

The amplitudes of the I, Q signals are set using the gain controls 45, 47. The depicted gain controls 45, 47 are configured to adjust the gain of the in-phase signal and the quadrature signal. Gain controls 45, 47 operate to maintain the receive operations of interrogator 26 within a linear region in a preferred embodiment. Automatic gain controls are preferably utilized to provide a variable amount of gain so the in-phase and quadrature signals are amplified without compressing or saturating components along the receive paths. Gain controls 45, 47 can control the levels of signals I, Q containing the desired information following removal of the direct path energy.

Further, the gain controls are preferably configured to maintain the amplitude of the in-phase signal relative to the amplitude of the quadrature signal while the gain of the respective signals is increased. It is desired to maintain the relative amplitudes of the in-phase and quadrature signals with reference to one another for downstream signal processing.

In particular, maintaining the relationship of the amplitude of the respective in-phase and quadrature signals reduces introduction of distortion during combining operations of the in-phase and quadrature signals. Received power can be divided upon the in-phase and quadrature signals in a varied fashion for any given message dependent upon the path length between the communicating devices. This information can be retained if the relationship of the amplitudes of the in-phase and quadrature signals are maintained during the gain increasing operations and other signal processing operations. Cascaded automatic gain control amplifiers 71, 73 and 75, 77 within the respective in-phase and quadrature signal paths are utilized to increase the dynamic range of the in-phase and quadrature signals provided through the respective gain controls 45, 47.

A detector or controller 49 is coupled with gain controls 45, 47 of the in-phase signal path and the quadrature signal path in the illustrated embodiment. One embodiment of controller 49 is configured to monitor the I and Q channel outputs of quadrature downconverter 84 and control the gain of gain controls 45, 47 such that the highest or peak levels of either the I or Q signals are maintained at a constant level. The AGC circuitry is preferably configured to maintain constant level signals for application to downstream modulation circuitry regardless of the input level from receive antenna R1. Such tends to maximize performance within downstream demodulation processing steps and minimize effects upon the I and Q channels prior to the demodulation.

The depicted controller 49 comprises a loop filter 79 and plural diodes 81, 83. Loop filter 79 and diodes 81, 83 are utilized in the described embodiment to control the gain adjustment of the in-phase and quadrature signals through respective gain controls 45, 47. Diode 81 couples the in-phase signal path with a node 87. Diode 83 couples the quadrature signal path with node 87. Loop filter 79 is coupled intermediate plural nodes 85, 87. Loop filter 79 is designed to apply a common control signal to AGC amplifiers 71, 73, 75, 77 of gain controls 45, 47 in the described embodiment.

More specifically, controller 49 is configured to output a control signal to AGC amplifiers 71, 73, 75, 77 of gain controls 45, 47 to control adjustment of the gain of the in-phase signal and the quadrature signal in a preferred embodiment of the invention. The common control signal is utilized to maintain the relationship of the amplitude of the in-phase signal relative to the amplitude of the quadrature signal. Such enables utilization of quadrature combination techniques to reconstruct the original signal.

Controller 49 is configured to output the control signal via node 85 corresponding and/or responsive to one of the in-phase signal and the quadrature signal having a greater amplitude.

Referring to FIG. 7, one embodiment of loop filter 79 is illustrated. The depicted loop filter 79 comprises a feedback loop consisting of an operational amplifier 89 and discrete devices coupled intermediate nodes 85, 87. Node 87 is coupled with diodes 81, 83 of the respective in-phase and quadrature signal paths. Loop filter 79 provides feedback control of in-phase and quadrature gain controls 45, 47. Diodes 81, 83 provide an OR function to utilize the individual I or Q signal having the higher amplitude to control automatic gain control amplifiers 71, 73, 75, 77. Diodes 81, 83 are provided to detect peak levels within the in-phase and quadrature signal paths. Diodes 81, 83 are configured to detect the signal having the higher amplitude.

Responsive to the detected peak voltages, controller 49 outputs control signals via node 85 to the respective in-phase and quadrature gain controls. The described RF circuitry 54 maintains the amplitude relationship of the I and Q signals for subsequent processing. The I and Q signals, which contain the DPSK modulated subcarrier, are passed to DPSK circuitry 52 for demodulation.

Referring to FIG. 8, DPSK circuitry 52 receives signals I and Q from RF circuitry 54. The I and Q signals contain the DPSK modulated subcarrier. The DPSK circuitry 52 includes anti-aliasing filters 56 and 58 filtering the I and Q signals, respectively, and analog to digital (A/D) converters 60, 62 respectively coupled to filters 56, 58 and respectively converting the filtered signals from analog to digital signals. DPSK circuitry 52 further includes a combiner 64, coupled to the A/D converters 60 and 62, combining the digital signals. DPSK circuitry 52 further includes a FIR matched filter 66, coupled to the combiner 64, which filters the combined signals. The DPSK circuitry 52 further includes delay circuitry 68 and multiplier circuitry 70 coupled to the FIR matched filter 66 for delaying the signal and multiplying the signal with the delayed signal to remove the subcarrier. DPSK circuitry 52 further includes low pass filter circuitry 72, coupled to the multiplier 70, filtering the output of the multiplier 70 to remove the X2 component. The DPSK circuitry 52 further includes a bit synchronizer 74 coupled to the filter 72 for regeneration of the data clock. The DPSK circuitry 52 further includes lock detect circuitry 76 coupled to the low pass filter 72 and generating a lock detect signal. The data, clock, and lock detect signals are sent to the EPP circuitry 50 for subsequent processing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An interrogator comprising:
    a downconverter configured to convert a communication signal to an in-phase signal and a quadrature signal;
    filters coupled with the downconverter and individually configured to filter direct path energy from one of the in-phase signal and the quadrature signal; and
    gain controls coupled with respective filters and the gain controls being individually configured to adjust the gain of one of the in-phase signal and the quadrature signal.

2. The interrogator according to claim 1 wherein the downconverter is configured to convert a microwave communication signal to the in-phase signal and the quadrature signal.

3. The interrogator according to claim 1 wherein the interrogator comprises an interrogator of a backscatter communication system.

4. The interrogator according to claim 1 wherein the gain controls are configured to maintain the amplitude of the in-phase signal relative to the amplitude of the quadrature signal.

5. The interrogator according to claim 1 wherein the filters comprise band pass filters.

6. The interrogator according to claim 1 wherein the in-phase signal and the quadrature signal individually having a subcarrier frequency.

7. The interrogator according to claim 6 wherein the filters are configured to filter the in-phase signal and the quadrature signal about the subcarrier frequency.

8. The interrogator according to claim 1 wherein the filters are individually configured to band limit one of the in-phase signal and the quadrature signal.

9. The interrogator according to claim 1 wherein the gain controls comprise automatic gain controls.

10. A backscatter system interrogator comprising:
    a downconverter configured to receive a backscatter communication signal having a first frequency and convert the backscatter communication signal having the first frequency to a subcarrier signal having a second frequency less than the first frequency;
    a filter coupled with the downconverter and configured to filter direct path energy from the subcarrier signal; and
    a gain control coupled with the filter and configured to adjust the gain of the filtered subcarrier signal.

11. The backscatter system interrogator according to claim 10 wherein the first frequency is a microwave frequency.

12. The backscatter system interrogator according to claim 10 wherein the gain control comprises an automatic gain control.

13. The backscatter system interrogator according to claim 10 wherein the gain control comprises cascaded automatic gain controls.

14. The backscatter system interrogator according to claim 10 where the filters comprise band pass filters.

15. A backscatter system interrogator comprising:
    a downconverter configured to convert a communication signal to an in-phase signal and a quadrature signal;
    gain controls coupled with the downconverter and individually configured to adjust the gain of one of the in-phase signal and the quadrature signal; and
    a controller coupled with the gain controls and configured to output a control signal to the gain controls to control adjustment of the gain of the in-phase signal and the quadrature signal.

16. The backscatter system interrogator according to claim 15 wherein the controller is configured to maintain the amplitudes of the in-phase signal and the quadrature signal relative to one another during the adjustment of the gain.

17. The backscatter system interrogator according to claim 15 wherein the gain controls individually comprise cascaded automatic gain controls.

18. The backscatter system interrogator according to claim 15 further comprising filters coupled with the downconverter and individually configured to remove direct path energy from one of the in-phase signal and the quadrature signal.

19. The backscatter system interrogator according to claim 15 wherein the controller is configured to output the control signal corresponding to one of the in-phase signal and the quadrature signal having a greater amplitude.

20. A communication system comprising:
an electronic communication device configured to output a communication signal; and
an interrogator configured to receive the communication signal, the interrogator being configured to downconvert the communication signal to a subcarrier signal and filter direct path energy from the subcarrier signal, the interrogator being further configured to adjust the gain of the subcarrier signal.

21. The communication system according to claim 20 wherein the communication system comprises a backscatter communication system.

22. The communication system according to claim 20 wherein the communication signal comprises a microwave communication signal.

23. The communication system according to claim 20 wherein the interrogator is configured to downconvert the communication signal to an in-phase signal and a quadrature signal.

24. The communication system according to claim 23 wherein the interrogator is configured to band limit the in-phase signal and the quadrature signal about a frequency of the subcarrier signal.

25. The communication system according to claim 23 wherein the interrogator is configured to adjust the gain of the in-phase signal and the quadrature signal using a common control signal.

26. A backscatter communication system comprising:
an electronic communication device configured to output a microwave reply signal responsive receiving a microwave command signal; and
an interrogator configured to output the microwave command signal and receive the microwave reply signal and downconvert the reply signal to an in-phase signal and a quadrature signal individually having a subcarrier frequency, the interrogator being configured to band pass filter the in-phase signal and the quadrature signal comprising analog signals about the respective subcarrier frequencies to remove direct path energy, the interrogator being further configured to generate a control signal corresponding to one of the in-phase signal and quadrature signal having a greater amplitude, and adjust the gain of the in-phase signal and the quadrature signal using the control signal.

27. A communication method comprising:
outputting a command signal;
receiving a reply signal responsive to the outputting the command signal;
downconverting the reply signal to a subcarrier signal;
removing direct path energy from the subcarrier signal; and
adjusting the gain of the subcarrier signal.

28. The method according to claim 27 wherein the removing comprises band pass filtering the reply signal about frequency of the subcarrier signal.

29. The method according to claim 27 wherein the receiving comprises receiving a microwave signal.

30. The method according to claim 27 wherein the downconverting provides an in-phase signal and a quadrature signal.

31. A backscatter communication method comprising:
receiving a backscatter communication signal;
downconverting the backscatter communication signal to an in-phase signal and a quadrature signal;
generating a control signal; and
adjusting the gain of the in-phase signal and the quadrature signal using the control signal, wherein the amplitudes of the in-phase signal and the quadrature signal are maintained relative to one another during the adjusting.

32. The method according to claim 31 wherein the generating corresponds to one of the in-phase signal and the quadrature signal having the greater amplitude.

33. The method according to claim 31 further comprising filtering the in-phase signal and the quadrature signal.

34. The method according to claim 31 further comprising removing direct path energy from the in-phase signal and the quadrature signal prior to the adjusting.

35. The method according to claim 31 further comprising band pass filtering the in-phase signal and the quadrature signal comprising analog signals about respective subcarrier frequencies of the in-phase signal and the quadrature signal.

36. A backscatter communication method comprising:
outputting a microwave command signal;
receiving a microwave backscatter signal responsive to the outputting the command signal;
downconverting the backscatter signal to an in-phase signal and a quadrature signal individually having a subcarrier frequency;
filtering the in-phase signal and the quadrature signal comprising analog signals about the respective subcarrier frequencies to remove direct path energy from the in-phase signal and the quadrature signal;
generating a gain control signal corresponding to one of the in-phase signal and quadrature signal having a greater amplitude; and
adjusting the gain of the in-phase signal and the quadrature signal using the gain control signal.

37. A method of processing a communication signal, the method comprising:
receiving a communication signal;
downconverting the communication signal to an in-phase signal and a quadrature signal;
removing direct path energy from the in-phase signal and the quadrature signal;
generating a gain control signal; and
adjusting the gain of the in-phase signal and the quadrature signal using the gain control signal.

38. The method according to claim 37 wherein the receiving comprises receiving a backscatter communication signal.

39. The method according to claim 37 wherein the receiving comprises receiving a microwave communication signal.

40. The method according to claim 37 wherein the in-phase signal and the quadrature signal individually have a subcarrier frequency and the removing comprises band pass filtering about the subcarrier frequency.

41. The method according to claim 40 wherein the receiving comprises receiving a backscatter communication signal.

42. The method according to claim 37 further comprising maintaining the amplitude of the in-phase signal relative to the amplitude of the quadrature signal during the adjusting.

43. The method according to claim 37 wherein the generating corresponds to one of the in-phase signal and the quadrature signal having a greater amplitude.

44. A method of processing a communication signal, the method comprising:

receiving a communication signal;

downconverting the communication signal to an in-phase signal and a quadrature signal;

removing direct path energy from the in-phase signal and the quadrature signal; and adjusting the gain of the in-phase signal and the quadrature signal.

45. The method according to claim 44 further comprising maintaining the amplitude of the in-phase signal relative to the amplitude of the quadrature signal during the adjusting.

46. The method according to claim 44 wherein the downconverting comprises downconverting the communication signal to the in-phase signal and the quadrature signal individually having a subcarrier frequency.

47. The method according to claim 46 wherein the removing comprises band pass filtering about the subcarrier frequency.

48. The method according to claim 47 wherein the receiving comprises receiving a backscatter communication signal.

49. The method according to claim 44 wherein the adjusting comprises adjusting the gain following the removing.

50. The method according to claim 44 wherein the adjusting the gain comprises adjusting using automatic gain controls.

51. The method according to claim 44 wherein the adjusting comprises using a common control signal corresponding to one of the in-phase signal and the quadrature signal having a greater amplitude.

52. The method according to claim 44 further comprising increasing the dynamic range of the in-phase signal and the quadrature signal using cascaded automatic gain controls.

53. The method according to claim 44 wherein the receiving comprises receiving a backscatter communication signal.

54. The interrogator according to claim 1 wherein the filters are individually configured to filter direct path energy from one of the in-phase signal and quadrature signal comprising an analog signal.

55. The backscatter system interrogator according to claim 10 wherein the filter is configured to filter direct path energy from the subcarrier signal comprising an analog signal.

56. The backscatter system interrogator according to claim 15 wherein the gain controls are individually configured to adjust the gain of one of the in-phase and the quadrature signal comprising an analog signal.

57. The communication system according to claim 20 wherein the interrogator is configured to filter direct path energy from the subcarrier signal comprising an analog signal.

58. The method according to claim 27 wherein the removing comprises removing direct path energy from the subcarrier signal comprising an analog signal.

59. The method according to claim 31 wherein the adjusting comprises adjusting the gain of the in-phase signal and the quadrature signal comprising analog signals.

60. The method according to claim 37 wherein the removing comprises filtering the in-phase signal and the quadrature signal comprising analog signals.

61. The method according to claim 44 wherein the removing comprises filtering the in-phase signal and the quadrature signal comprising analog signals.

* * * * *

UNITED STATES PATENT AND TRADEMARK OFFICE
CERTIFICATE OF CORRECTION

PATENT NO. : 6,324,211 B1
DATED : November 27, 2001
INVENTOR(S) : David K. Ovard et al.

Page 1 of 1

It is certified that error appears in the above-identified patent and that said Letters Patent is hereby corrected as shown below:

<u>Column 9,</u>
Line 31, after "100" please insert -- kHz --.

Signed and Sealed this

Twenty-first Day of May, 2002

Attest:

Attesting Officer

JAMES E. ROGAN
*Director of the United States Patent and Trademark Office*